United States Patent
Hamada et al.

(10) Patent No.: US 7,353,483 B2
(45) Date of Patent: Apr. 1, 2008

(54) ELEMENT ARRANGEMENT CHECK DEVICE AND PRINTED CIRCUIT BOARD DESIGN DEVICE

(75) Inventors: Seiji Hamada, Osaka (JP); Hirotsugu Fusayasu, Uji (JP); Shoichi Mimura, Hirakata (JP); Miyoko Irikiin, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 224 days.

(21) Appl. No.: 10/556,892

(22) PCT Filed: Feb. 14, 2005

(86) PCT No.: PCT/JP2005/002127

§ 371 (c)(1),
(2), (4) Date: Nov. 15, 2005

(87) PCT Pub. No.: WO2005/081142

PCT Pub. Date: Sep. 1, 2005

(65) Prior Publication Data

US 2006/0288317 A1 Dec. 21, 2006

(30) Foreign Application Priority Data

Feb. 20, 2004 (JP) ............................. 2004-044329

(51) Int. Cl.
*G06F 17/50* (2006.01)
*G06F 9/45* (2006.01)
(52) U.S. Cl. ................ 716/15; 716/5; 716/11
(58) Field of Classification Search .................... 716/5, 716/11, 15
See application file for complete search history.

(56) References Cited

U.S. PATENT DOCUMENTS 6,546,528 B1 * 4/2003 Sasaki et al. .................. 716/5

(Continued)

FOREIGN PATENT DOCUMENTS

EP 1 168 208 1/2002

(Continued)

OTHER PUBLICATIONS

Bruce Carter, "How (Not) to Decouple High-Speed Operational Amplifiers" [Online] Sep. 2001, pp. 1-4, retrieved from the Internet: URL:http://focus.ti.com/lit/an/sloa069/sloa069.pdf> [retrieved on Sep. 14, 2006].

(Continued)

*Primary Examiner*—Jack Chiang
*Assistant Examiner*—Magid Y. Dimyan
(74) *Attorney, Agent, or Firm*—Wenderoth, Lind & Ponack, L.L.P.

(57) ABSTRACT

An element placement check system for checking element placement on a printed wiring board having wiring by which a power supply terminal of an integrated circuit and a power supply decoupling element for the power supply terminal are connected on a mounting surface on which the integrated circuit is mounted, wherein the wiring is connected to a power supply plane for providing a direct current power supply to the power supply terminal through a power supply via hole, including: element distance detecting means detecting a first wire length between the power supply decoupling element and the power supply terminal; power supply via hole distance detecting means detecting a second wire length between the power supply via hole and the power supply terminal; and determination means determining a positional relationship of the power supply decoupling element and the power supply via hole to the power supply terminal based on the first and second wire lengths, thereby providing a check system and a printed wiring board design system capable of checking a connection sequence of a power supply decoupling element such as a bypass capacitor and the power supply via hole connected to the power supply plane feeding a direct current power supply to the power supply terminal as viewed from the power supply terminal of an integrated circuit.

13 Claims, 9 Drawing Sheets

U.S. PATENT DOCUMENTS

| | | | |
|---|---|---|---|
| 7,120,893 B2 * | 10/2006 | Sasaki et al. | 716/15 |
| 2002/0017907 A1 | 2/2002 | Araki et al. | |
| 2006/0070015 A1 * | 3/2006 | Iwaki et al. | 716/11 |

FOREIGN PATENT DOCUMENTS

| | | |
|---|---|---|
| JP | 2002-15023 | 1/2002 |
| JP | 2002-16337 | 1/2002 |

OTHER PUBLICATIONS

Leroy Davis, "Leroys engineering Web Site; Design; Capacitors" [Online] Oct. 4, 2003, Retrieved from the Internet: URL:http://web.archive.org/web/20031004115319/http://www.interfacebus.com/Design_Capacitors.html> [retrieved on Sep. 14, 2006].

* cited by examiner

ELEMENT ARRANGEMENT CHECK DEVICE AND PRINTED CIRCUIT BOARD DESIGN DEVICE

TECHNICAL FIELD

This invention relates to an element placement check system for a printed wiring board and a printed wiring board design system, and particularly, an element placement check system for a bypass capacitor placed in the neighborhood of a power supply terminal of an integrated circuit.

BACKGROUND ART

On a printed wiring board having high speed integrated circuits thereon, bypass capacitors have been usually placed in the neighborhoods of power supply terminals of each of the integrated circuits.

It has been generally known that a bypass capacitor plays a role to cause a through current generated at a power supply terminal when a high speed integrated circuit is switched to flow back to ground in the neighborhood of the power supply terminal to thereby prevent propagation of high frequency energy (a high frequency component) onto the power supply plane and a role to provide a direct current power supply to the integrated circuit.

That is, if a placement position of a bypass capacitor is inappropriate, high frequency energy from the power supply terminal is not removed sufficiently and spreads all over the power supply plane, leading to a possibility of serving as a source of radiation noise.

A proposal has been offered of placement check of the bypass capacitor, wherein a predetermined value is provided for a distance or the like from the power supply terminal to the bypass capacitor and it is checked whether or not the bypass capacitor has been placed at the predetermined value or less, or a capacity value of the bypass capacitor to be placed is checked.

Besides, it has been checked manually with the naked eye or the like, or alternatively, with a check system whether or not a printed wiring board that has been designed with a printed wiring board CAD does not meet check conditions with respect to placement.

In placement of a bypass capacitor on a printed wiring board, what is important is not only a distance from the power supply terminal to the bypass capacitor and a capacity value thereof, but also a connection sequence of the bypass capacitor and the power supply via hole connected to the power supply plane as viewed from the power supply terminal. In a case where the power supply via hole connected to the power supply plane is nearer the power supply terminal than the bypass capacitor, a through current generated from the power supply terminal flows into the power supply plane before the current flows back to ground the bypass capacitor; therefore, an effect of power supply decoupling is reduced.

In light of the problem, proposals have been offered of a check method or a check system, for example, in Patent document 1 in which it is determined whether or not a decoupling capacitor is inserted in the neighborhood of a power supply terminal of an integrated circuit, where is the optimal insert position and what is the optimal capacity value.

SUMMARY OF THE INVENTION

Problems to be Solved by the Invention

In a conventional check method, however, it is impossible to correctly check a connection sequence of the bypass capacitor and the power supply via connected to the power supply plane, and there has been available no check system having such a check function either.

It is accordingly an object of the invention to provide a check system and a printed wiring board design system capable of checking a connection sequence of a power supply decoupling element such as a bypass capacitor and the power supply via hole connected to the power supply plane feeding a direct current power supply to the power supply terminal as viewed from the power supply terminal of an integrated circuit.

Means for Solving the Problems

An element placement check system pertaining to the invention is, in order to achieve the object, directed to a device for checking element placement on a printed wiring board having wiring by which a power supply terminal of an integrated circuit and a power supply decoupling element for the power supply terminal are connected on a mounting surface on which the integrated circuit is mounted, wherein the wiring is connected to a power supply plane for providing a direct current power supply to the power supply terminal through a power supply via hole, including: element distance detecting means detecting a first wire length between the power supply decoupling element and the power supply terminal; power supply via hole distance detecting means detecting a second wire length between the power supply via hole and the power supply terminal; and determination means determining a positional relationship of the power supply decoupling element and the power supply via hole to the power supply terminal based on the first and second wire lengths.

EFFECTS OF THE INVENTION

An element placement check system pertaining to the invention with the construction can determine whether or not a positional relationship capable of removing a high frequency component with ease is established by checking the positional relationship such as a connection sequence of a power supply decoupling element and a power supply via hole based on the first wire length between the power supply terminal of the integrated circuit and the power supply decoupling element and the second wire length between the power supply terminal and the power supply via hole.

According to an element placement check system and a printed wiring board design system pertaining to the invention, it can be checked whether or not a connection sequence effective for reduction in radiation noise of a printed wiring board is established, thereby enabling a printed wiring board with a high degree of completeness to be designed from the viewpoint of EMC (Electromagnetic Compatibility).

REFERENCE NUMERALS

Figure 1:
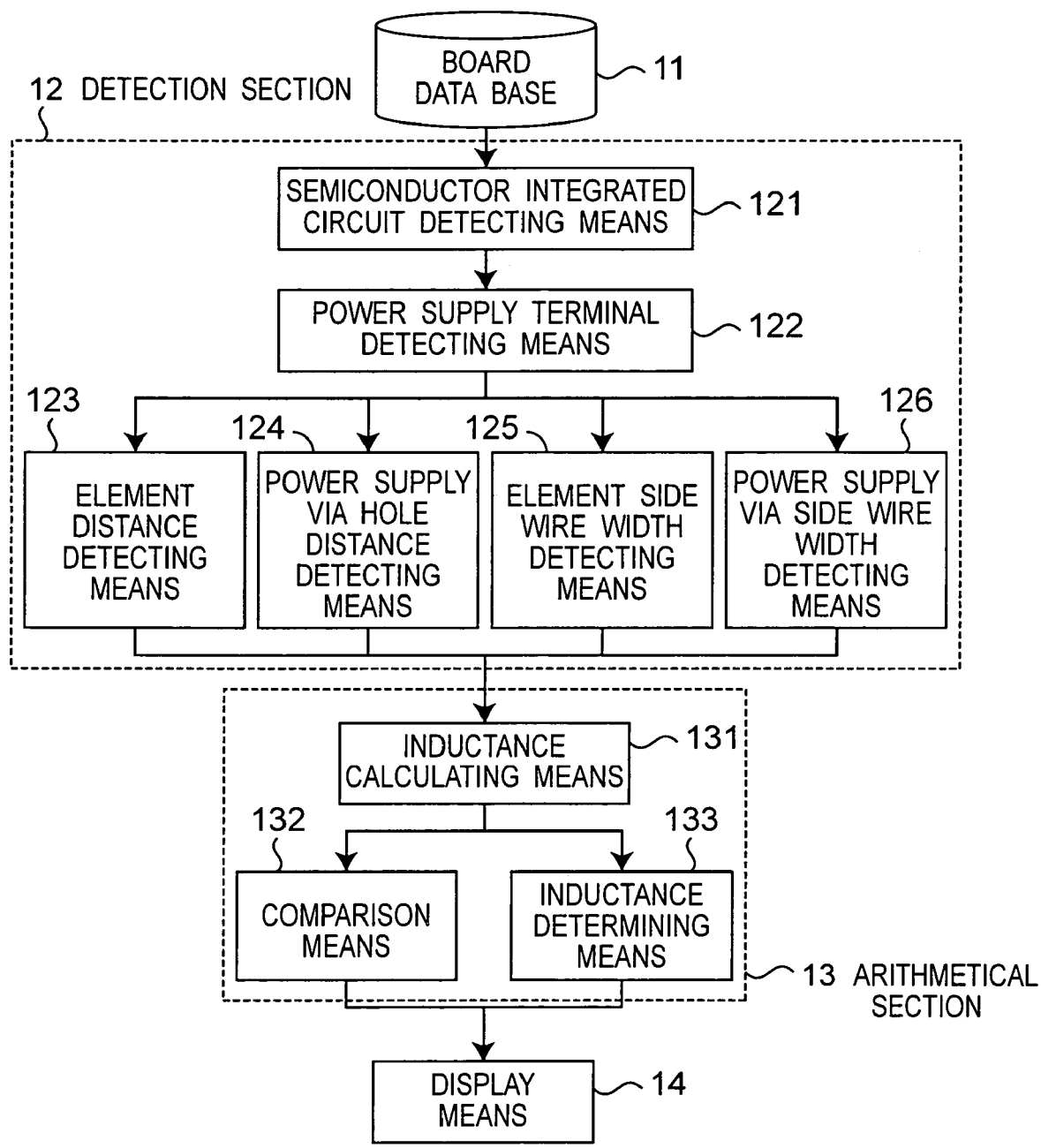
FIG. 1 is a block diagram showing a configuration of an element placement check system for a printed wiring board of a first embodiment pertaining to the invention.

1 Semiconductor integrated circuit
2 Power supply terminal
3 Power supply via hole
4 Bypass capacitor
5 Ground layer connection via
11 Board data base section
12 Detection section
13 Arithmetical section

DETAILED DESCRIPTION OF THE INVENTION

Description will be given of embodiments pertaining to the invention with reference to the accompanying drawings.

First Embodiment

An element placement check system of a first embodiment pertaining to the invention has a wiring pattern for mounting an integrated circuit and a power supply decoupling element and the like connected to a power supply terminal of the integrated circuit on a mounting surface, wherein in printed wiring board design that the wiring pattern is connected to a power supply plane for providing the power supply through a power supply via hole, it can check whether or not there has been established placement and the wiring pattern of elements such as the power supply terminal of the integrated circuit, the power supply decoupling element and the power supply via hole effectively bypasses a high frequency component with the help of the power supply decoupling element to thereby enable a through current to be effectively prevented.

Note that an element placement check system for a printed wiring board pertaining to the invention can also check element placement on a multilayer printed wiring board including a wiring layer and a power supply layer and, in addition thereto, a ground layer (a ground conductor layer).

That is, in a case where, for example, a power supply decoupling element, which is a bypass capacitor, connected to a power supply terminal of an integrated circuit is far from the power supply terminal, power supply wiring is longer to thereby increase an inductor component and to lower a frequency band of high frequency signals capable of passing through a bypass capacitor, thereby causing a possibility of obtaining no bypass effect in a desired band. Since a loop in which a through current flowing out from the power supply terminal flows into ground (ground conductor) through the bypass capacitor is longer, a radiation noise increases. A wiring length from the power supply terminal to the bypass capacitor greatly contributes as a factor to increase in the loop area, so that a predetermined value of an inductance component between the power supply decoupling and the power supply terminal is determined mainly.

Whether or not a high frequency component can be removed by a power supply decoupling element such as a bypass capacitor is affected not only by an inductance value (a wire length) between the power supply decoupling element and the power supply, but also by a relationship between an inductance value (a wiring length) between the power supply decoupling element and the power supply terminal and an inductance value (a wire length) between the power supply terminal and the power supply via hole.

That is, if an inductance value (a wire length) between the power supply decoupling element and the power supply terminal is less than an inductance value (a wire length) between the power supply terminal and the power supply via hole, a high frequency component can be removed more effectively by the power supply decoupling element, thereby enabling propagation of high frequency energy to the power supply plane to reduce. That is, there is a preferable positional relationship of the power supply decoupling element and the power supply via hole to the power supply terminal to be connected in order to effectively reduce propagation of high frequency energy to the power supply plane.

That is, a check system for element placement of the first embodiment is a system capable of determining with an inductance value based on a wire length (a distance) and determining a sequence of the power supply decoupling element and the power supply via hole based on a wire length (a distance), and thereby, the system checks about whether or not a wiring pattern design is implemented such that it satisfies reduction in high frequency energy propagation to a power supply plane and reduction in radiation noise simultaneously.

Detailed description will be given of an element placement check system of the first embodiment below.

The first embodiment of the invention will be described based on FIGS. 1 and 2.

Figure 2:
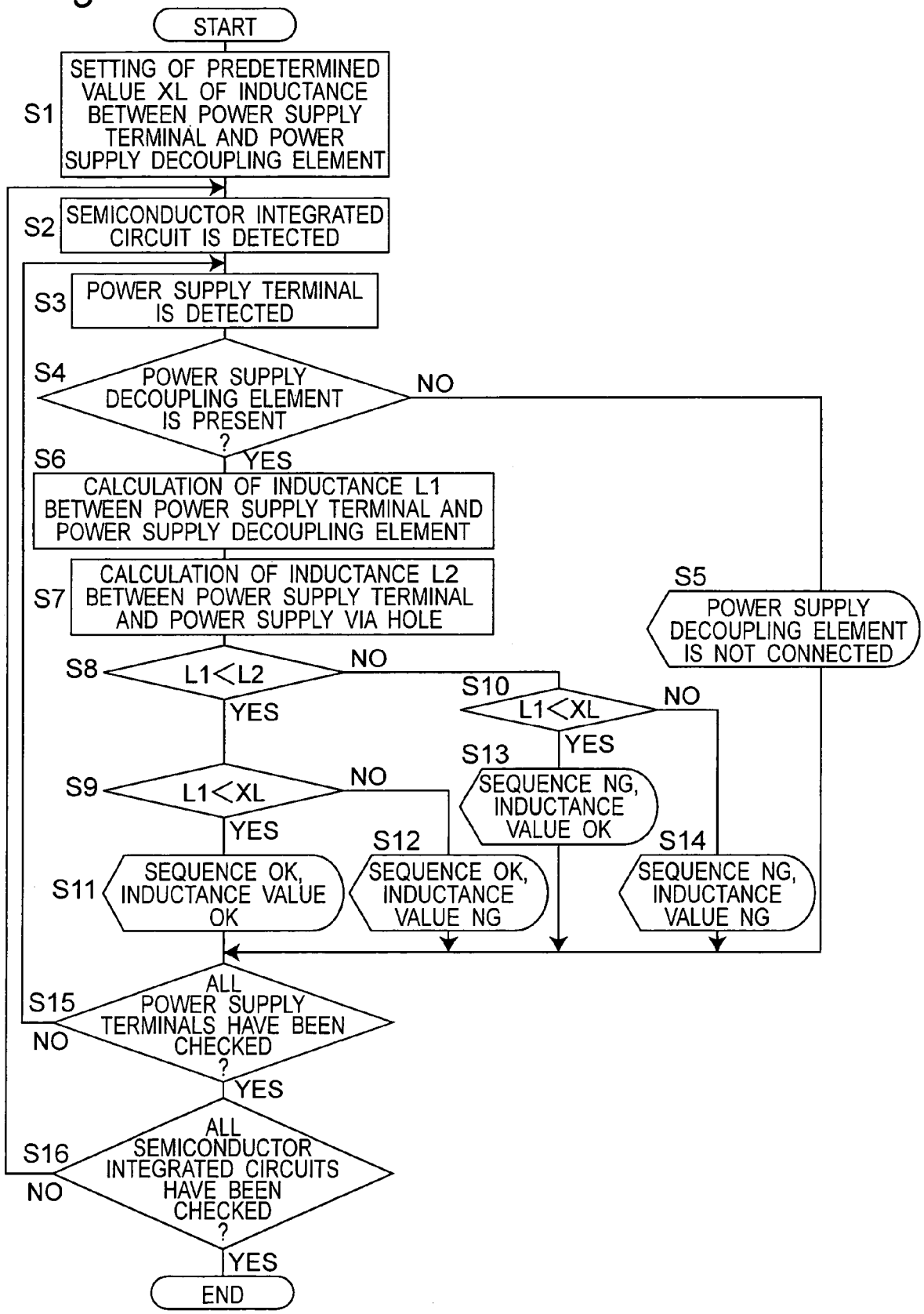
FIG. 2 is a flowchart showing a processing procedure in the element placement check system for a printed wiring board pertaining to the first embodiment.

FIG. 1 is a block diagram showing a configuration of an element placement check system for a printed wiring board pertaining to the first embodiment of the invention.

An element placement check system for a printed wiring board of the first embodiment includes: a board data base section 11; a detection section 12; an arithmetic and logic section 13 and a display means 14.

In the first embodiment, the detection section 12 includes: integrated circuit detecting means 121 detecting an integrated circuit or integrated circuits (parts such as IC and LSI); power supply terminal detecting means 122 detecting a power supply terminal of each of the integrated circuits; element distance detecting means 123; power supply via hole distance detecting means 124; element side wire width detecting means 125; and power supply via hole side wire width detecting means 126.

The element distance detecting means 123 detects a distance (a wire length) between a power supply terminal of the semiconductor circuit and a power supply decoupling element, and the element side wire width detecting means 125 detects a line width of the wire between the power supply terminal 2 and the power supply decoupling element.

The power supply via hole distance detecting means 124 detects a distance between the power supply terminal of the integrated circuit and the power supply via hole, and the power supply via hole side wire width detecting means 126 detects the width of the wire between the power supply terminal and the power supply via hole.

The arithmetic and logic section 13 includes: inductance calculating means 131, comparison means 132 and inductance determining means 133.

The inductance calculating means 131 calculates the inductance value of the wire between a power supply terminal of the integrated circuit and the power supply decoupling element based on the distance (the wire length) between the power supply terminal thereof and the power supply decoupling element, and the line width of the wire between the power supply terminal thereof and the power supply decoupling element; and calculates an inductance value between the power supply terminal thereof and the power supply via hole based on the distance (the wire length) between the power supply terminal thereof and the power supply via hole and the line width of the wire between the power supply terminal thereof and the power supply via hole.

The comparison means 132 compares a preset predetermined value XL of a wire inductance between the power supply terminal and the power supply decoupling element with a wire inductance value between the power supply terminal and the power supply decoupling element to determine whether or not the calculated wire inductance value is the predetermined value XL or less.

The inductance determining means 133 determines whether or not a wire inductance value between the power supply terminal and the power supply decoupling element is less than an inductance value between the power supply terminal and the power supply via hole and determines whether or not a placement sequence of the power supply decoupling element and the power supply via hole is proper.

The display means 14 displays a result of the comparison in the comparison means 132 and a result of the determination in the inductance determining means 133. For example, if a placement sequence of the power decoupling element and the power supply via hole is inappropriate, the display means 14 presents an error display urging correction to thereby stimulate a designer's attention.

Description will be given of a processing operation of the first embodiment below based on the flowchart shown in FIG. 2.

In step S1, set is the predetermined value XL of a wire inductance between a power supply terminal 2 and the power supply decoupling element.

In step S2, detected is one integrated circuit from a board data base 11 storing a print wiring board.

In step S3, detected is one power supply terminal from the detected integrated circuit.

In step S4, it is checked whether or not the power supply decoupling element is connected to the detected power supply terminal and if the terminal is not connected, the process advances to step S5 while if the terminal is connected, the process advances to step S6.

In step S5, displayed are, for example, a part number of the integrated circuit, a pin number of the power supply terminal and a message saying "bypass capacitor is not connected" as an error display.

In step S6, the distance (D1) of the wire from the detected power supply terminal to the power supply decoupling element and a width W1 of the wire are detected, and an inductance value L1 of the wire between the power supply terminal and the power supply decoupling element is calculated based on the distance (D1) and the wire width W1.

In step S7, the distance (D2), which is the length of the wire from the detected power supply terminal to the power supply via hole and the width W2 of the wire are detected, and an inductance value L2 of the wire between the power supply terminal and the power supply via hole is calculated based on the distance (D2) and the wire width W2.

In step S8, the calculated inductance L1 and the calculated inductance L2 are compared with each other and if $L1 < L2$, the process advances to step S9, while if $L1 \geq L2$, the process advances to step S10.

In step S9, the calculated inductance L1 and the predetermined inductance value XL are compared with each other, and if $L1 < XL$, the process advances to step S11, while if $L1 \geq XL$, the process advances to step S12.

In step S10, the calculated inductance L1 and the predetermined inductance value XL are compared with each other, and if $L1 < XL$, the process advances to step S13, while if $L1 \geq XL$, the process advances to step S14.

In step S11, displayed are, for example, a part number of the integrated circuit, a pin number of the power supply terminal and a part number of the power supply decoupling element and a message saying "connection sequence is correct. Inductance value is predetermined value or less."

In step S12, displayed are, for example, a part number of the integrated circuit, a pin number of the power supply terminal and a part number of the power supply decoupling element and a message saying "connection sequence is correct. Inductance value exceeds predetermined value" as an error display.

In step S13, displayed are, for example, a part number of the integrated circuit and a part number of the power supply decoupling element and a message saying "connection sequence is incorrect. Inductance value is predetermined value or less" as an error display.

In step S14, displayed are, for example, a part number of the integrated circuit, a pin number of the power supply terminal and a part number of the power supply decoupling element and a message saying "connection sequence is incorrect. Inductance value exceeds predetermined value"

In step S15, it is determined whether or not all of the power supply terminals of the detected semiconductor circuit have been checked and if all have not been checked, the process returns to step S3, where the next power supply terminal is detected, and a series of checks is conducted. If all have been checked, the process advances to step S16.

In step S16, it is determined whether or not all of the semiconductor circuits in the board data base have been checked and if all have not been checked, the process returns to step S2, where the next integrated circuit is detected, and a series of checks is conducted. If all have been checked, the process is terminated.

Below shown is an example calculation of the inductance L of a microstrip line wiring with a structure in which a line with the width W is formed on the upper surface of, for example, a board with a thickness H and a relative permittivity $\epsilon r$ and a ground conductor sufficiently wider than the line width is formed on the lower surface so as to face the line.

First of all, a characteristic impedance $Z_0$ (ohm) of the micro strip line is expressed by the following equation (1):

$$Z_0=[87/\sqrt{(\epsilon r+1.41)}]\ln[5.98H/(0.8W+T)] \quad (1)$$

A capacity $C_0$ (pF/inch) of each unit length is expressed by the following equation (2).

$$C_0=0.67(\epsilon r+1.41)]\ln[5.98H/(0.8W+T)] \quad (2)$$

From the equations (1) and (2), an inductance $L_0$ (pH/inch) of each unit length is given by the following equation (3).

$$L_0=C_0 Z_0^2 \quad (3)$$

Accordingly, an inductance L(pH) of a wire length D (inch) is given by the following equation (4).

$$L=DL_0 \quad (4)$$

Note that description has been given of a way to obtain an inductance in the example wire using the microstrip line, while the invention is not limited only to this case and, for example, the invention may also be applied to a construction using a different transmission line in which the inductance of a strip line or the like obtained by providing a line conductor in the interior of a board can be calculated.

Then, description will be given of an example concrete check in a system of the first embodiment with reference to FIG. 3.

Figure 3:
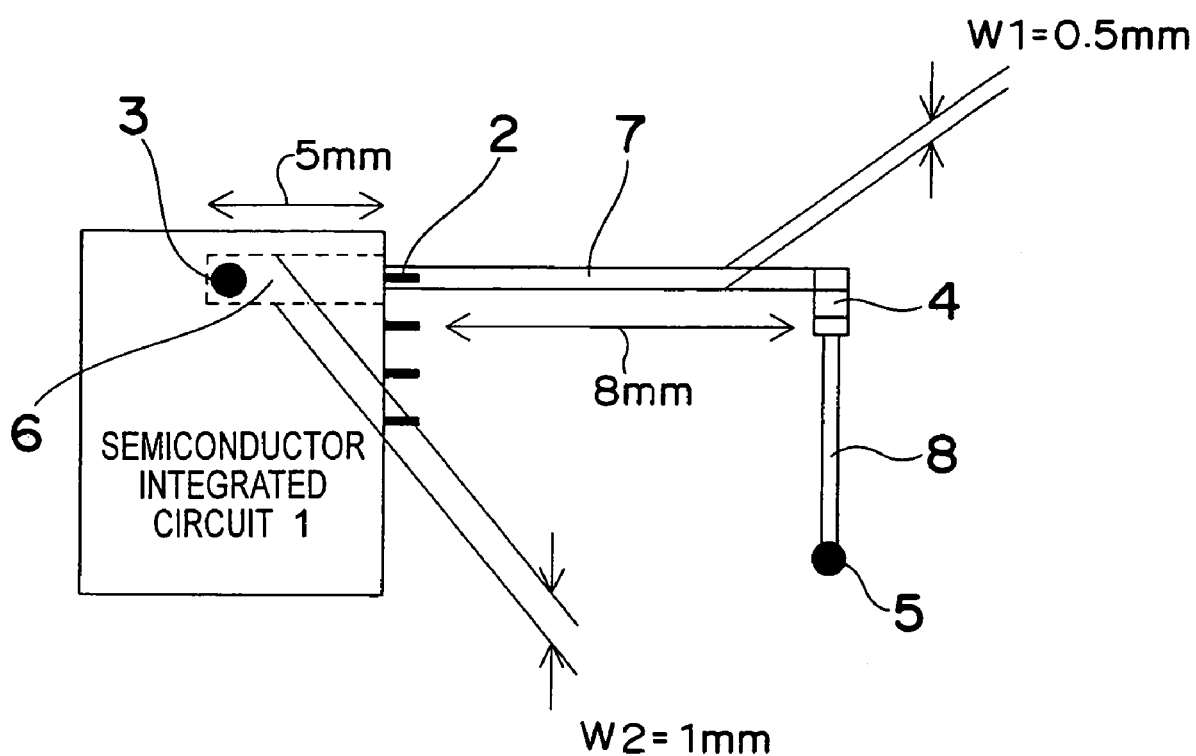
FIG. 3 is an element placement diagram showing an example way for checking the element placement using the element placement check system for a printed wiring board pertaining to the first embodiment.

FIG. 3 shows an example including the one power supply terminal 2 of the one integrated circuit 1 that has been detected in step S2 and a bypass capacitor 4 (a power supply decoupling element 4) connected to the power supply terminal 2.

In the example of FIG. 3, there is a difference between the width of the wire 7 from the power supply terminal 2 to the power supply decoupling element 4 (shown as a bypass capacitor 4 in FIG. 3) and the width of the wire 6 from the power supply terminal 2 to a power supply via hole 3, and the wire between the power supply terminal 2 and the power supply via hole 3 is provided on the other side of the power supply terminal 2 from the wire between the power supply terminal 2 and the power supply decoupling element 4.

In the example, the distance (D1=8 mm), which is the length of the wire 7 from the power supply terminal 2 to the power supply decoupling element 4 and the width (W1=0.5 mm) of the wire 7 are detected and the inductance value L1 of the wire 7 between the power supply terminal 2 and the power supply decoupling element 4 is calculated using the equations (1) to (4), wherein D1=8 mm and W1=0.5 mm.

In step S7, the distance (D2=5 mm), which is the length of a wire 6 from the detected power supply terminal 2 to the power supply via hole 3 and the width (W2=1 mm) of the wire 6 are detected and the inductance value L2 of the wire 6 between the power supply terminal 2 and the power supply via hole 3 is calculated using the equations (1) to (4), wherein D2=5 mm and W2=1 mm.

In step S8, the calculated inductance L1 and the calculated inductance L2 are compared with each other and if L1<L2, the process advances to step S9, where the inductance value L1 and the predetermined inductance value XL are compared with each other and if L1<XL, the process advances to step S11.

In step S11, displayed are a part number of the integrated circuit 1, a pin number of the power supply terminal 2 and a part number of the power supply decoupling element 4 and further displayed are, for example, a message saying "the connection sequence is correct. The inductance value is the predetermined value or less."

An element placement check system for a printed wiring board of the first embodiment with the construction checks a positional relationship such as a connection sequence of a power supply decoupling element and a power supply via hole with the inductance value calculated based on the wire length between the power supply terminal of an integrated circuit and the power supply coupling element and the inductance value calculated based on the wire length between the power supply terminal and the power supply via hole; therefore, it is properly determined with ease whether or not a positional relationship is established so as to effectively remove a high frequency component.

An element placement check system of the first embodiment compares the wire inductance value between a power supply terminal and a power supply decoupling element with the wire inductance between the power supply terminal and a power supply via hole and thereby, it is determined whether or not a placement sequence of the power supply decoupling element and the power supply via hole is proper; therefore, a determination on a placement sequence can be performed even in a case where wires from the power supply terminal 2, as shown in FIG. 3, extend two ways (a direction toward the power supply via hole 3 and a direction toward the power supply decoupling element 4 are opposite each other) and the widths of the wires are different from each other.

The element placement check system of the first embodiment can properly determine a sequence of element placement and is very excellent in general versatility even in a case where the sequence cannot be simply determined only by distances between elements since the sequence of element placement is determined with inductance values calculated based on impedances of the different widths of wires.

Second Embodiment

Figure 4:
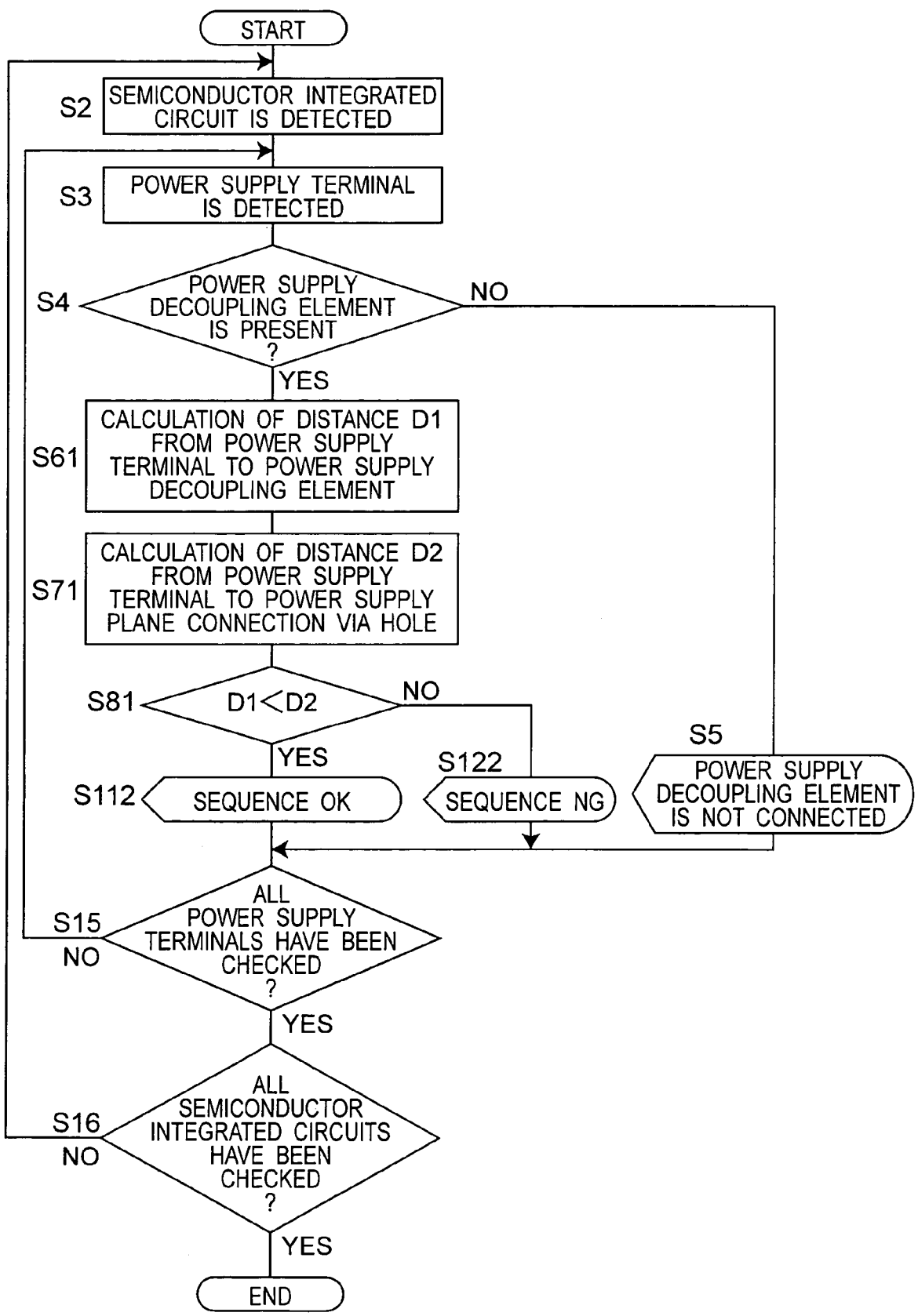
FIG. 4 is a flowchart showing a processing procedure in an element placement check system for a printed wiring board of a second embodiment pertaining to the invention.

Then, further description will be given of the processing in the second embodiment using a simplified processing in the first embodiment with reference to a flowchart shown in FIG. 4.

To be concrete, the second embodiment has a step S61 of detecting the distance (D1), which is the length of the wire, from a power supply terminal to a power supply decoupling element instead of step S6 of calculating the inductance value L1 of the wire between the power supply terminal and the power supply decoupling element based on the distance (D1), which is the length of the wire from the power supply terminal to the power supply decoupling element and width W1 of the wire, and further has step S71 of detecting the distance (D2), which is the length of the wire from the power supply terminal to the power supply via hole instead of step S7 of calculating the inductance value L2 of the wire between the power supply terminal and the power supply via hole.

In step S81 instead of step S6, the distance (D1), which is the length of the wire from the power supply terminal to the power supply decoupling element with the distance (D2), which is the length of the wire from the power supply terminal to the power supply via hole are compared with each other and if D1<D2, the process advances to step S112, while if D1≧D2, the process advances to step S122.

In step S112 instead of step S11, for example, displayed are a part number of an integrated circuit, a pin number of a power supply terminal and a part number of a power supply decoupling element and further displayed is a message saying "a connection sequence is correct."

In step S122 instead of step S12, for example, displayed are a part number of an integrated circuit, a pin number of a power supply terminal and a part number of a power supply element and further displayed is a message saying "a connection sequence is incorrect" as an error display.

The process subsequent thereto is conducted in a similar way to that in the first embodiment below.

Note that in the second embodiment, the system is simplified only so as to check a placement sequence and performs no determination with a specification value; therefore, process steps S1, S9, S10 and S12 to S14 in the first embodiment, which are associated with the check and the determination, are omitted due to the simplification and no determination.

Then, description will be given of a concrete example check in the second embodiment with reference to FIG. 5.

Figure 5:
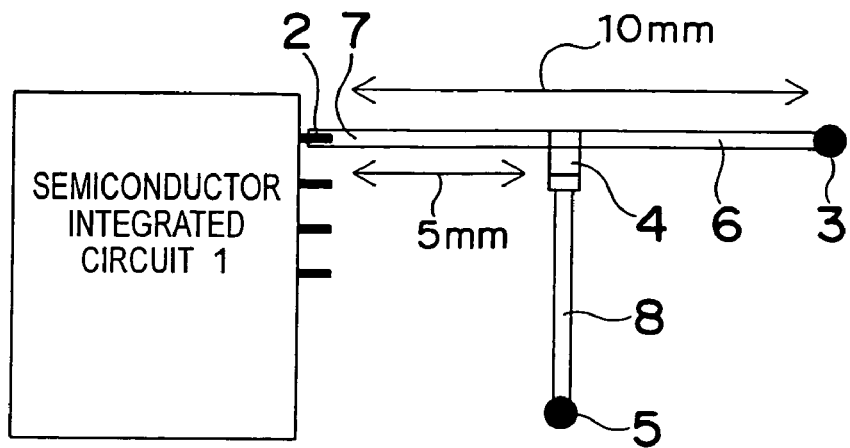
FIG. 5 is an element placement diagram showing an example way for checking the element placement using the element placement check system for a printed wiring board pertaining to the second embodiment.

FIG. 5 shows, in a similar way to the concrete example shown in FIG. 3, an example including one power supply terminal 2 of the integrated circuit 1 that has been detected in step S2 and a bypass capacitor 4 (a power supply decoupling element 4) connected to the power terminal 2, while the example of FIG. 5 is different from the concrete example of the first embodiment in that, in the example of FIG. 5, the power supply decoupling element 4 and the power supply via hole 3 are provided on one side of the power supply terminal 2.

The widths of wires 6 to 8 shown in FIG. 5 are set to the same width.

The example of FIG. 5 is an example in the neighborhood of one power supply terminal 2 of an integrated circuit 1 on a printed wiring board on which a correct connection sequence is established in placement.

In the example, first in step S2, an integrated circuit 1 is detected, in step S3 a power supply terminal 2 is detected, in step S4 it is confirmed whether or not a bypass capacitor has been connected to the power supply terminal 2 and since the bypass capacitor has been connected to the power supply terminal 2, the process advances to S61.

In step S61, measured is the distance D1 (for example, 5 mm), which is the length of the wire 7 from the power supply terminal 2 to the bypass capacitor 4 and the process advances to step S71.

In step S71, measured is the distance D2 (for example 10 mm), which is the length of the wires 7 and 6 combined from the power supply terminal 2 to the power supply via hole 3, which is a connection via to a power supply layer from the power supply terminal 2 and the process advances to step S81.

In step S81, D1 and D2 are compared with each other and since D1<D2, the process advances to step S112.

In step S112, displayed is a part number of the integrated circuit 1, a pin number of the power supply terminal 2 and a part number of a bypass capacitance 4 and a message saying "connection sequence is correct" and the process advances to step S15.

The steps described above are repeated till the end of check and thereafter, the process is terminated.

Figure 6:
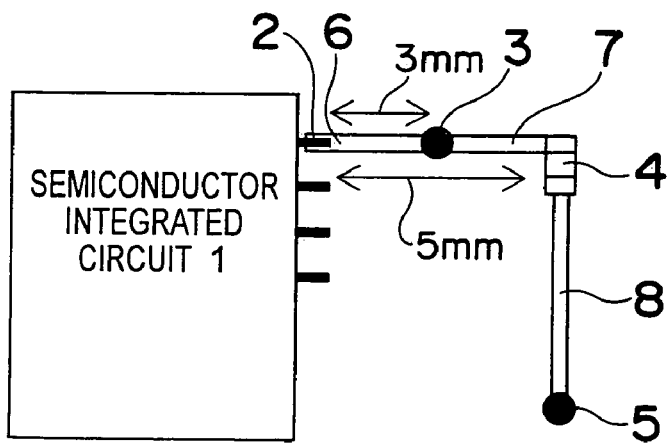
FIG. 6 is an element placement diagram different from FIG. 5 showing an example way for checking using the element placement check system for a printed wiring board pertaining to the second embodiment.

Then, description will be given of a concrete example in a case where a placement sequence (connection sequence) is incorrect with reference to FIG. 6.

In the example, a process from step S1 to step S4 is similar to those in the example of FIG. 5 and the process advances from step S4 to step S61.

In step S61, measured is the distance D1 (for example, 5 mm), which is the length of the wires 6 and 7 combined from the power supply terminal 2 to the bypass capacitance 4 and in step S71, measured is the distance D2 (for example, 3 mm), which is the length of the wire 6 from the power supply terminal 2 to the power supply via hole 3 and the process advances to step S81.

In step S81, D1 and D2 are compared with each other and since D1>D2, the process advances to step S122.

In step S122, displayed are a part number of the integrated circuit 1, a pin number of the power supply terminal 2 and a part number of the bypass capacitor 4, and further displayed is a message saying "connection sequence is incorrect" and the process advanced to step S15.

The above steps are repeated and when all of integrated circuits have been checked, the process is terminated.

Then, description will be given of an example pattern on a printed wiring board to which the element placement check system of the second embodiment is applicable.

Figure 7:
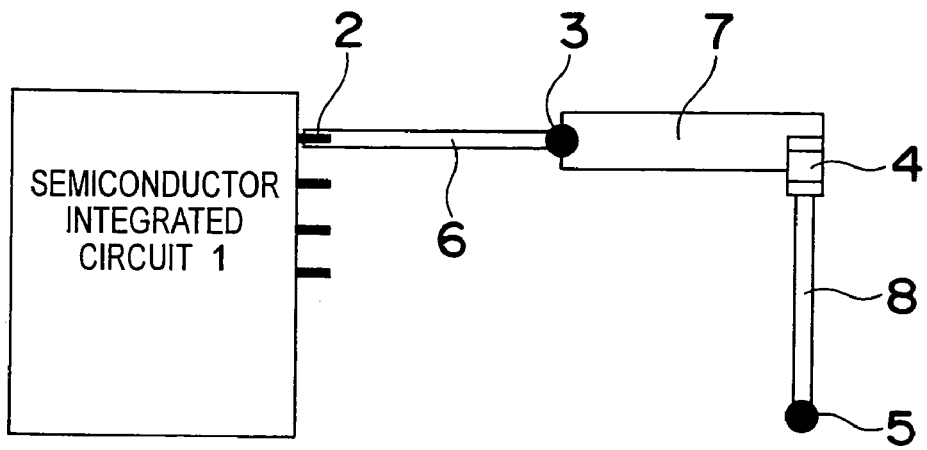
FIG. 7 is a top plan view showing an example element placement (1) capable of being checked using the element placement check system for a printed wiring board pertaining to the second embodiment.

In a pattern shown in FIG. 7, the power supply terminal 2 of the integrated circuit 1 is connected to one end of the bypass capacitor 4 through the wires 6 and 7 and the other end of the bypass capacitor 4 is connected to the ground layer connection via 5 through a wire 8.

A power supply via hole 3 is provided at a boundary portion between the wires 6 and 7.

In the pattern of FIG. 7, the wires 6 and 7 are formed in different widths, wherein the wire 7 is more in width than the wire 6.

Figure 8:
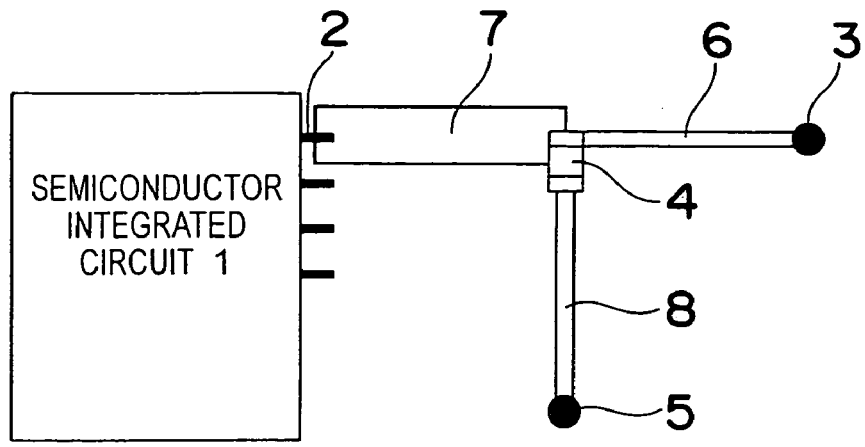
FIG. 8 is a top plan view showing an example element placement (2) capable of being checked using the element placement check system for a printed wiring board pertaining to the second embodiment.

In a pattern shown in FIG. 8, the power supply terminal 2 of the integrated circuit 1 is connected to one end of a bypass capacitor 4 through the wire 7 and the other end of the bypass capacitor 4 is connected to a ground layer connection via 5 through the wire 8.

The wire 6 extends from one end of the wire 7 to which one end of the bypass capacitor 4 is connected and power supply via hole 3 is provided at the distal end of the wire 6.

In the pattern of FIG. 8, the wires 6 and 7 have different widths from each other and the wire 7 is more in width than the wire 6.

Figure 9:
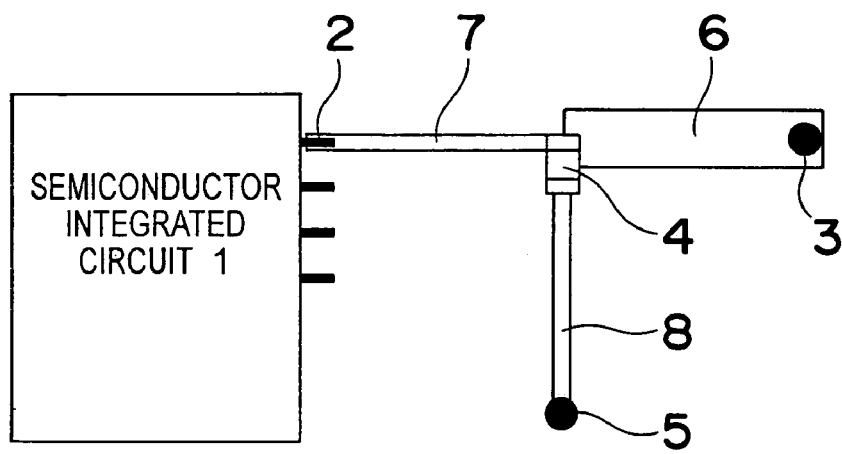
FIG. 9 is a top plan view showing an example element placement (3) capable of being checked using the element placement check system for a printed wiring board pertaining to the second embodiment.

In a pattern shown in FIG. 9, the power supply terminal 2 of the integrated circuit 1 is connected to one end of the bypass capacitor 4 through the wire 7 and the other end of the bypass capacitor 4 is connected to the ground layer connection via 5 through the wire 8.

The wire 6 extends from the one end of the wire 7 to which the one end of the bypass capacitor 4 is connected and power supply via hole 3 is provided at the distal end of the wire 6.

In the pattern of FIG. 9, the wires 6 and 7 have different widths from each other and the wire 7 is less in width than the wire 6.

Figure 10:
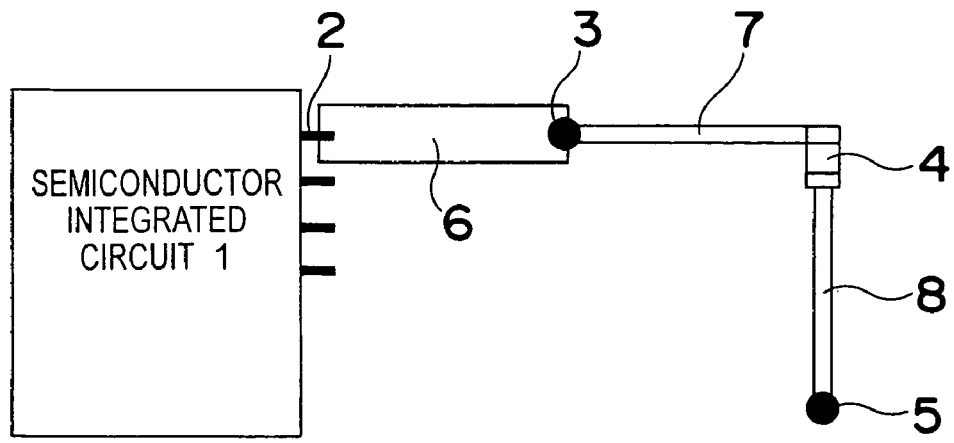
FIG. 10 is a top plan view showing an example element placement (4) capable of being checked using the element placement check system for a printed wiring board pertaining to the second embodiment.

In a pattern shown in FIG. 10, the power supply terminal 2 of the integrated circuit 1 is connected to one end of the bypass capacitor 4 through the wires 6 and 7 and the other end of the bypass capacitor 4 is connected to the ground layer connection via 5 through the wire 8.

The power supply via hole 3 is provided at the boundary portion between the wires 6 and 7.

In the pattern of FIG. 10, the wires 6 and 7 have different widths from each other and the wire 7 is less in width than the wire 6.

In a case where, as shown in FIGS. 7 to 10 that have been described, the power supply via hole 3 is formed in the wire in series therewith between the power supply terminal 2 and one end of the bypass capacitor 4 or on extension of the wire between the power supply terminal 2 and one end of the bypass capacitor 4, element placement can be checked with the element placement check system of the second embodiment even if a line width varies in the same wire.

Figure 11:
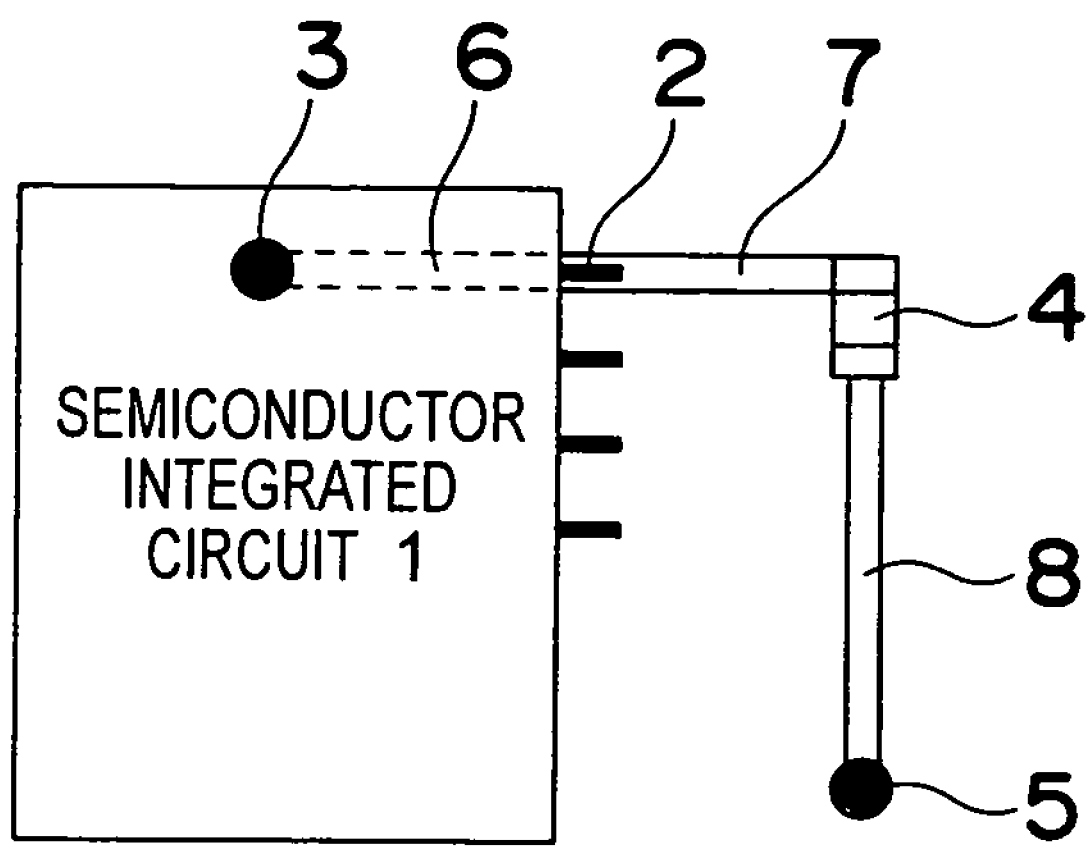
FIG. 11 is a top plan view showing an example element placement (5) capable of being checked using the element placement check system for a printed wiring board pertaining to the second embodiment.

Even in a case where the power supply via hole 3 is not formed in the wire in series therewith between the power supply terminal 2 and one end of the bypass capacitor 4 or on extension of the wire between the power supply terminal 2 and one end of the bypass capacitor 4, as shown in FIG. 11, element placement can be checked with the element placement check system of the second embodiment if the wire 6 connecting the power supply terminal 2 of the integrated circuit 1 and the power supply via hole 3 to each other and the wire 7 connecting the power supply terminal 2 and one end of the bypass capacitor 4 to each other are equal in line width.

Note that in a case where, in the placement shown in FIG. 11, the wire 6 connecting the power supply terminal 2 and the power supply via hole 3 to each other and the wire 7 connecting the power supply terminal 2 and one end of the bypass capacitor 4 are different in width from each other (in a case where the inductances of the wires are different from each other), element placement cannot be checked with the element placement check system of the second embodiment.

A placement sequence can be determined by the element placement check system for a printed wiring board of the second embodiment in a case where, as detailed above, the impedance of the wire between the power supply terminal and the power supply via hole and the impedance of the wire between the power supply terminal and the power supply decoupling element are equal to each other, or in a case where a given relationship is established as shown in FIGS. 7 to 10 even if the impedance of the wire between the power supply terminal and the power supply via hole and the impedance of the wire between the power supply terminal and the power supply decoupling element are different from each other.

That is, the element placement check system for a printed wiring board of the second embodiment can determine a placement sequence in an easy form only by comparative simple wire lengths (distances) without comparing the inductances based on impedances which requires a complex calculation in order to be obtained, except a special case where wires from the power supply terminal 2 are aligned in two directions (a direction toward the power supply via hole 3 and a direction toward the power supply decoupling element 4 are opposite each other) and the widths of wires are different from each other.

Third Embodiment

Figure 12:
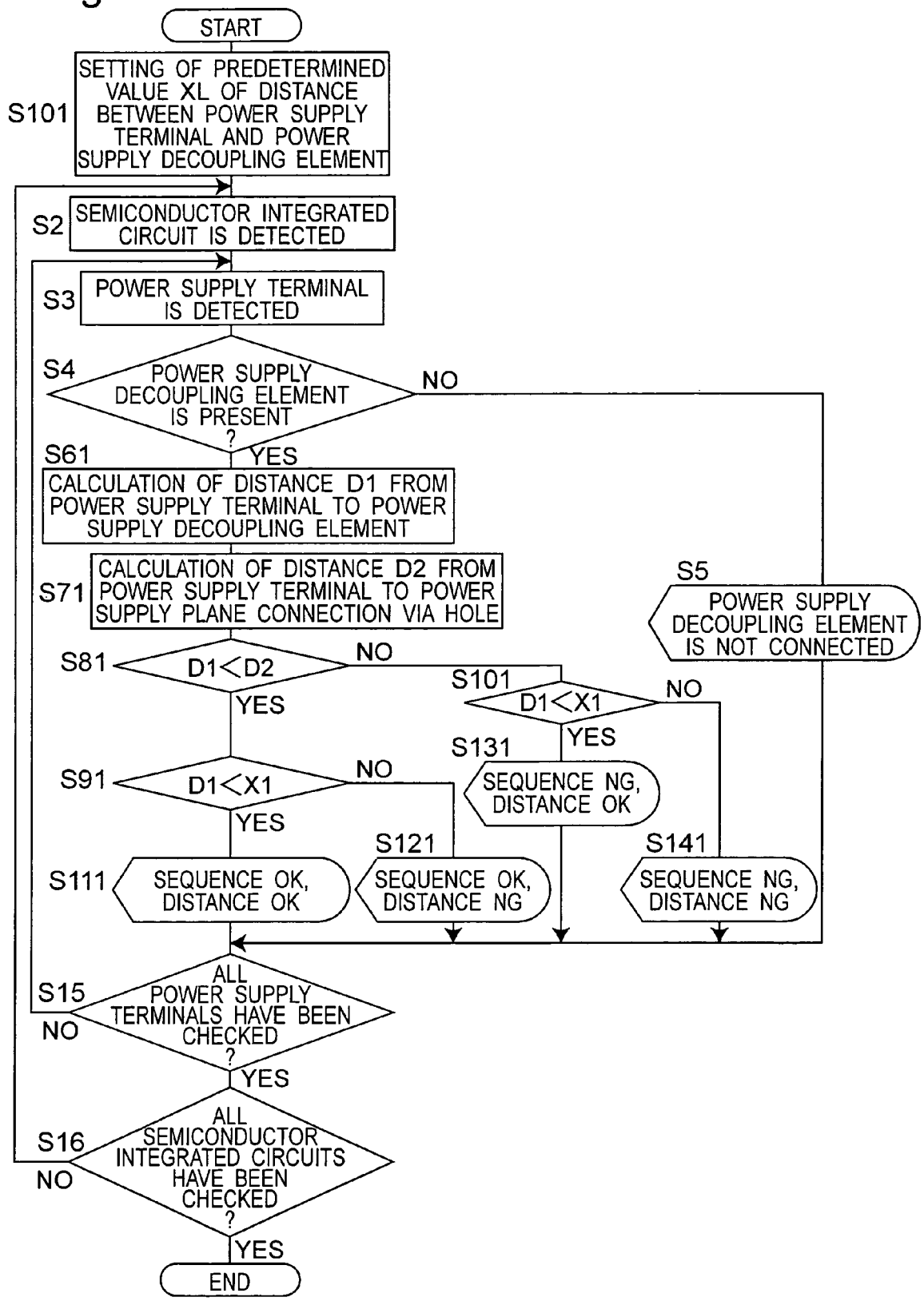
FIG. 12 a flowchart showing a processing procedure in an element placement check system for a printed wiring board pertaining to a third embodiment.

Description will be given of a printed wiring board element placement check processing method of the third embodiment of the invention based on a flowchart shown in FIG. 12.

The printed wiring board element placement check processing method of the third embodiment, in a similar way to that in the printed wiring board element placement check processing method of the second embodiment, checks a connection sequence based on the distance (D1), which is the length of the wire from the power supply terminal to the power supply decoupling element and the distance (D2), which is the length of the wire from the power supply terminal to the power supply via hole and the third embodiment is different from the second embodiment in that a predetermined value is given to the distance from the power supply terminal to the power supply decoupling element and a distance is checked simultaneously in addition to a connection sequence.

To be concrete, added in the process are: step S101 of setting a predetermined value X1 for the distance from a power supply terminal to a power supply decoupling element; and steps S91 and S101 of determining whether or not the distance D1, which is the length of the wire from the power supply terminal to the power supply decoupling element, is the predetermined value X1 or less, and further provided are steps S111, S121, S131 and S141 of displaying results of check on not only a sequence but also a distance, instead of steps S112 and S122.

In the printed wiring board element placement check processing method of the third embodiment with the above construction, a process up to step S71 is conducted in a similar way to that in the second embodiment and the process advances to step S81 from step S71.

In step S81, the measured D1 and D2 are compared with each other and if D1<D2, the process advances to step S91, while if D1≧D2, the process advances to step S101.

In step S91, the measured D1 and the predetermined value X1 are compared with each other, if D1<X1, the process advances to step S111, while if D1≧X1, the process advances to step S121.

In step S101, the measured D1 and the predetermined value X1 are compared with each other, if D1<X1, the process advances to step S131, while if D1≧X1, the process advances to step S141.

In step S111, displayed are, for example, a part number of an integrated circuit, a pin number of a power supply terminal, and a part number of a bypass capacitor, and a message saying "connection sequence is correct. A distance up to bypass capacitor is the predetermined value or less" and the like.

In step S121, displayed are, for example, a part number of an integrated circuit, a pin number of a power supply terminal, and a part number of a bypass capacitor, and a message saying "connection sequence is correct. A distance up to bypass capacitor exceeds the predetermined value" and the like.

In step S131, displayed are, for example, a part number of an integrated circuit, a pin number of a power supply terminal, and a part number of a bypass capacitor, and a message saying "connection sequence is incorrect. A distance up to bypass capacitor is the predetermined value or less" and the like as an error display.

In step S141, displayed are, for example, a part number of an integrated circuit, a pin number of a power supply terminal, and a part number of a bypass capacitor, and a message saying "connection sequence is incorrect. A distance up to bypass capacitor exceeds the predetermined value" and the like.

In step S15, it is determined whether or not all of the power supply terminals of the detected integrated circuit have been checked and if all have not been checked, the process returns to step S3, where the next power supply terminal is detected, and a series of check are applied thereto. If all have been checked, the process advances to step S16.

In step S16, it is determined whether or not all of the integrated circuits in a wiring board data base have been checked and if all have not been checked, the process returns to step S2, where the next integrated circuits is detected, and a series of check are applied thereto. If all have been checked, the process is terminated.

Description will be given of the printed wiring board element placement check processing method of the third embodiment using a concrete pattern example.

Figure 13:
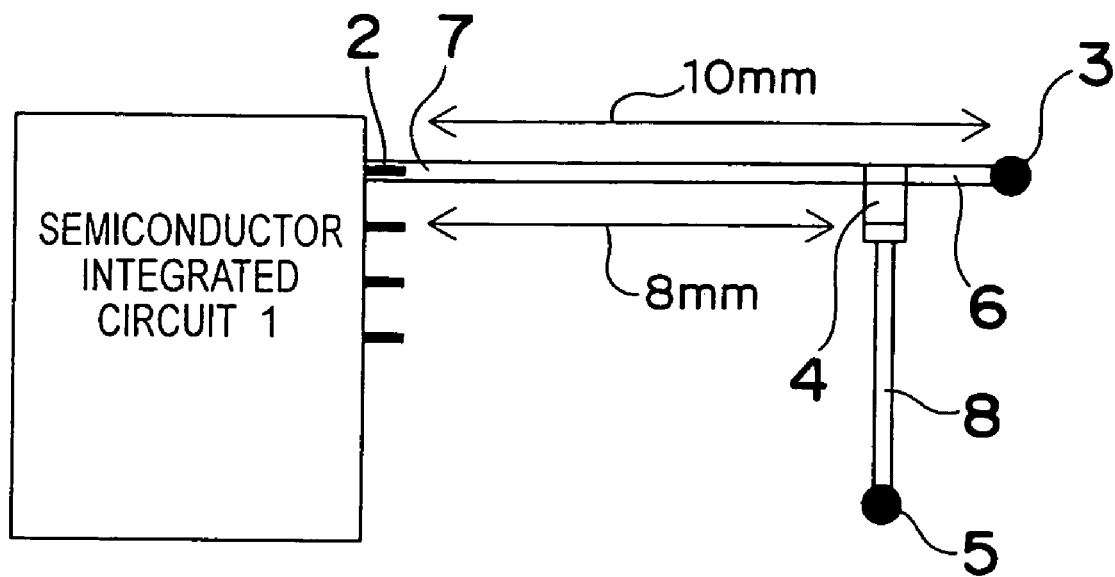
FIG. 13 is an element placement diagram (1) showing an example way for checking the element placement using the element placement check system for a printed wiring board pertaining to the third embodiment

FIG. 13 is an example placement in which the distance from the power supply terminal 2 to the bypass capacitor 4 is not the predetermined value or less, though a connection sequence is correct.

In the example, first in step S101, set to, for example, 5 mm is the predetermined value X1 for the distance from the power supply terminal 2 to the power supply decoupling element 4 and the process returns to step S2.

In step S2, an integrated circuit 1 is detected, in step S3 a power supply terminal 2 is detected, in step S4 it is confirmed whether or not the power supply decoupling element 4 has been connected to the power supply terminal 2 and since the power supply decoupling element 4 has been connected, the process advances to step S61.

In step S61, the distance D1 (for example, 8 mm) of the wire 7 from the power supply terminal 2 to the bypass capacitor 4 is measured and the process advances to step S71.

In step S71, measured is the distance D2 (for example, 10 mm) of wires 7 and 6 combined from the power supply terminal 2 to the power supply via hole 34 and the process advances to step S81.

In step S81, D1 and D2 are compared with each other and since D1<D2, the process advances to step S91.

In step S91, D1 and X1 are compared with each other and since D1>X1, the process advances to step S121.

In step S121, displayed are a part number of the integrated circuit 1, a pin number of the power supply terminal 2 and a part number of the bypass capacitance 4 and a message saying "connection sequence is correct. Distance up to bypass capacitor exceeds the predetermined value" as an error display and the process advances to step S15.

In step S15 and those subsequent thereto, it is determined that the check has been completed and the process is terminated.

Figure 14:
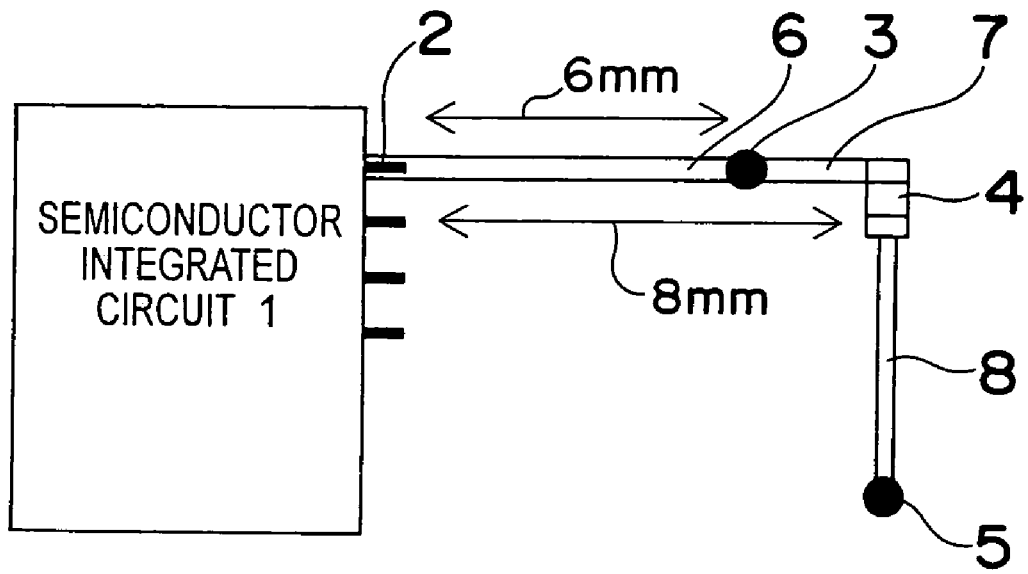
FIG. 14 is an element placement diagram (2) showing an example way for checking the element placement using the element placement check system for a printed wiring board pertaining to the third embodiment

Then, description will be given of a concrete example check based on FIG. 14. FIG. 14 is an example placement in the neighborhood of one power supply terminal 2 of an integrated circuit 1 on a printed wiring board on which a connection sequence is incorrectly placed in the above check and the distance of the wires 6 and 7 combined from the power supply terminal 2 to a bypass capacitor 4 is not the predetermined value or less.

In step S101, first, set to, for example, 5 mm is the predetermined value X1 from the power supply terminal 2 to the bypass capacitor 4 and the process returns to step S2.

In a process from S2 to S5, the process is performed in a similar way to that in the concrete example of FIG. 13 and the process advances to step S61.

In step S61, measured is the distance D1 (for example, 8 mm) of the wires 6 and 7 combined from the power supply terminal 2 to the bypass capacitor 4 and the process advanced to step S71.

In step S71, measured is the distance D2 (for example, 6 mm) of the wire 6 from the power supply terminal 2 to the power supply via hole 3 and the process advanced to step S81.

In step S81, D1 and D2 are compared with each other and since D1>D2, the process advances to step S101.

In step S101, D1 and X1 are compared with each other and since D1>X1, the process advances to step S141.

In step S141, displayed are a part number of the integrated circuit 1, a pin number of the power supply terminal 2 and a part number of the bypass capacitance 4 and a message saying "connection sequence is incorrect. Distance up to bypass capacitor exceeds the predetermined value" as an error display and the process advances to step S15.

In step S15 and those subsequent thereto, it is determined that the check has been completed and the process is terminated.

Fourth Embodiment

A printed wiring board design system (a printed wiring board CAD) of the fourth embodiment pertaining to the invention is a printed wiring board design system constructed so as to include an element placement check system according to any of the first to third embodiments.

In the printed wiring board design system of the fourth embodiment, a connection sequence is checked by an element placement check system, for example, when a power supply decoupling element such as a bypass capacitor is placed and wiring is designed or when a position of a power supply via hole connected to a power supply plane is defined, and a display urging correction can be presented in a case where the power supply via hole connected to the power supply plane is located on the power supply terminal side of the power supply decoupling element.

By combining a check system into the printed wiring board design system as in the fourth embodiment, design can proceed while the printed wiring board being checked at a design stage.

An element placement check system for a printed wiring board and a printed wiring board design system of the invention is useful in performing board design hard to emit radiation noise on a printed wiring board on which a high speed integrated circuit is mounted.

The invention claimed is:

1. An element placement check system for checking element placement an a printed wiring board having wiring by which a power supply terminal of a semiconductor integrated circuit and a power supply decoupling element for the power supply terminal are connected on a mounting surface on which the semiconductor integrated circuit is mounted, in which the wiring is connected to a power supply plane for providing a direct current power supply to the power supply terminal through a power supply via hole, the system comprising:

element distance detecting means for detecting a first wire length between the power supply decoupling element and the power supply terminal;

power supply via hole distance detecting means for detecting a second wire length between the power supply via hole and the power supply terminal; and determination means for determining a positional relationship of the power supply decoupling element and the power supply via hole to the power supply terminal based on the first and second wire lengths.

2. The element placement check system according to claim 1, wherein said determination means comprises:

inductance calculating means in which a first inductance value is calculated based on the first wire length and a second inductance value is calculated based on the second wire length, the first inductance value being an inductance value of a wire between the power supply terminal of the semiconductor integrated circuit and the power supply decoupling element, and the second inductance value being an inductance value of a wire between the power supply via hole and the power supply terminal; and inductance comparison determining means in which the positional relationship of the power supply decoupling element and the power supply via hole to the power supply terminal is determined by comparing the first inductance value with the second inductance value.

3. The element placement check system according to claim 2, further comprising means to determine whether or not the first inductance value is less than a predetermined value.

4. The element placement check system according to claim 1, wherein said determination means determines the positional relationship of the power supply decoupling element and the power supply via hole to the power supply terminal by comparing the first wire length with the second wire length.

5. The element placement check system according to claim 4, further comprising means to determine whether or not the first wire length is less than a predetermined value.

6. The element placement check system according to claim 1, wherein said printed wiring board is a multilayer board having a ground plane in addition to said mounting surface and said power supply plane.

7. A printed wiring board design system comprising the element placement check system according to claim 1.

8. An element placement check method for checking element placement on a printed wiring board having wiring by which a power supply terminal of a semiconductor integrated circuit and a power supply decoupling element for the power supply terminal are connected on a mounting surface on which the semiconductor integrated circuit is mounted, in which the wiring is connected to a power supply plane for providing a direct current power supply to the power supply terminal through a power supply via hole, the method comprising:

a step of detecting a first wire length between the power supply decoupling element and the power supply terminal;

a step of detecting a second wire length between the power supply via hole and the power supply terminal; and a determination step of determining a positional relationship of the power supply decoupling element and the power supply via hole to the power supply terminal based on the first and second wire lengths.

9. The element placement check method according to claim 8, wherein said determination step comprises:

a step of calculating a first inductance value based on the first wire length and a second inductance value based on the second wire length, the first inductance value being an inductance value of a wire between the power supply terminal of the semiconductor integrated circuit and the power supply decoupling element, and the second inductance value being an inductance value of a wire between the power supply via hole and the power supply terminal; and an inductance comparison determining step of determining the positional relationship of the power supply decoupling element and the power supply via hole to the power supply terminal by comparing the first inductance value with the second inductance value.

10. The element placement check method according to claim 9, further comprising a step of determining whether or not the first inductance value is less than a predetermined value.

11. The element placement check method according to claim 8, wherein said determination step comprises determining the positional relationship of the power supply decoupling element and the power supply via hole to the power supply terminal by comparing the first wire length with the second wire length.

12. The element placement check method according to claim 11, further comprising a step of determining whether or not the first wire length is less than a predetermined value.

13. A computer-readable medium having a program stored thereon for causing a computer to execute an element placement check method for checking element placement on a printed wiring board having wiring by which a power supply terminal of a semiconductor integrated circuit and a power supply decoupling element for the power supply terminal are connected on a mounting surface on which the semiconductor integrated circuit is mounted, in which the wiring is connected to a power supply plane for providing a direct current power supply to the power supply terminal through a power supply via hole, the method comprising:

a step of detecting a first wire length between the power supply decoupling element and the power supply terminal;

a step of detecting a second wire length between the power supply via hole and the power supply terminal; and a determination step of determining a positional relationship of the power supply decoupling element and the power supply via hole to the power supply terminal based on the first and second wire lengths.

* * * * *